US006693969B1

(12) United States Patent
Montalvo et al.

(10) Patent No.: US 6,693,969 B1
(45) Date of Patent: Feb. 17, 2004

(54) PHASE-LOCKED LOOP METHODS AND STRUCTURES FOR GENERATING MODULATED COMMUNICATION SIGNALS WITH NONCONSTANT ENVELOPES

(75) Inventors: Antonio J. Montalvo, Raleigh, NC (US); Simon Atkinson, Heathfield (GB)

(73) Assignee: Analog Devices, Inc., Norwood, MA (US)

( * ) Notice: Subject to any disclaimer, the term of this patent is extended or adjusted under 35 U.S.C. 154(b) by 455 days.

(21) Appl. No.: 09/689,288

(22) Filed: Oct. 11, 2000

(51) Int. Cl.⁷ .............................................. H04L 27/00
(52) U.S. Cl. ...................... 375/259; 332/128; 332/127; 455/76
(58) Field of Search ................................ 375/146, 259, 375/260, 261, 268, 270, 271, 278, 280, 284, 285, 295, 296, 297, 301, 302, 326, 362, 375, 376; 455/75, 76, 108, 110, 112, 113, 115, 119, 126; 332/117, 120, 123, 124, 125, 126, 127, 128, 159, 160, 161, 162; 331/15, 17, 18, 22, 25, 34, 44

(56) References Cited

U.S. PATENT DOCUMENTS

| 5,784,402 A | 7/1998 | Feher .......................... 375/200 |
| 5,825,257 A | 10/1998 | Klymyshyn et al. ........ 332/100 |
| 5,952,895 A | 9/1999 | McCune et al. ............ 332/128 |
| 5,966,055 A | 10/1999 | Knoedl et al. .............. 332/103 |

FOREIGN PATENT DOCUMENTS

| DE | 3242480 | 5/1984 |
| EP | 209754 | 1/1987 |
| FR | 2755556 | 5/1998 |
| WO | 9943080 | 8/1999 |
| WO | 0030250 | 5/2000 |

Primary Examiner—Khai Tran
Assistant Examiner—Khanh Cong Tran
(74) Attorney, Agent, or Firm—Koppel, Jacobs, Patrick & Heybl

(57) ABSTRACT

Phase-locked loop methods and structures are provided for generating modulated communication signals with nonconstant envelopes. These methods and structures realize the improved communication performance of nonconstant-envelope modulations with the upconversion advantages of phase-locked loops. The structures include transmitters in which a phase-locked loop is augmented with first and second feedforward paths that substantially restore phase and amplitude information to a transmit signal that is generated by a voltage-controlled oscillator of the phase-locked loop. The first feedforward path is configured to realize a path transfer function of $s/K_v$ wherein the voltage-controlled oscillator has a transfer function of $K_v/s$. The second feedforward path extracts an envelope-correction signal from the modulated intermediate-frequency signal and a variable-gain output amplifier amplifies the transmit signal with a gain that responds to the envelope-correction signal.

25 Claims, 7 Drawing Sheets

FREQUENCY-DIFFERENTIATING THE MODULATED
INTERMEDIATE-FREQUENCY SIGNAL ～79

FIG. 2B

OBTAINING THE PHASE DIFFERENCE BETWEEN THE
INTERMEDIATE-FREQUENCY SIGNAL AND THE ～124
MODULATED INTERMEDIATE-FREQUENCY SIGNAL

DIFFERENTIATING THE PHASE DIFFERENCE ～126

FIG. 2C

PHASE LOCKING A VOLTAGE-CONTROLLED OSCILLATOR
TO THE MODULATED INTERMEDIATE-FREQUENCY SIGNAL ～137

PROVIDING A CONTROL SIGNAL OF
THE VOLTAGE-CONTROLLED OSCILLATOR ～139

PHASE-LOCKED LOOP METHODS AND STRUCTURES FOR GENERATING MODULATED COMMUNICATION SIGNALS WITH NONCONSTANT ENVELOPES

BACKGROUND OF THE INVENTION

1. Field of the Invention

The present invention relates generally to the generation of communication signals and, more particularly, to the generation of nonconstant-envelope communication signals.

2. Description of the Related Art

A variety of communication systems modulate information signals onto radio frequency carrier signals for transmission between system users. Because the information signals are often baseband signals, the modulated carrier signals must be generated with some type of frequency upconversion that translates lower frequency signals to higher frequency signals. In one conventional upconversion method, communication signals are converted in a nonlinear mixing process with local-oscillator signals to produce sum and difference signals. After this mixing process, filters are used to select a desired sum signal which is then amplified to form a transmit signal.

Although this upconversion method is effective, it requires space to house the necessary circuit elements (e.g., mixers, local oscillators, amplifiers and filters) and substantial power to operate these elements. Because space and power are severely limited in a number of communication devices (e.g., in handheld radio telephones), a need exists for an upconversion method that reduces the demand on space and power.

This demand is often met with a phase-locked loop which is a closed-loop system in which a voltage-controlled oscillator directly generates the transmit signal. In response to a modulated signal and a sample of the transmit signal, a phase detector generates an error signal which is coupled to control the voltage-controlled oscillator through a loop filter that establishes a loop bandwidth. The modulation is thereby processed onto the transmit signal which is simultaneously upconverted because the sample signal is typically passed through a frequency divider before it is applied to the phase detector. Accordingly, phase-locked loops are used in a variety of radio transmitters because they provide the necessary upconversion process while providing significant advantages (e.g., reduced parts count, space and power drain).

However, upconversion via phase-locked loops has generally been limited to constant-envelope modulations (e.g., gaussian minimum shift keying (GMSK)). Various nonconstant-envelope modulations (e.g., shifted M-ary phase shift keying (PSK)) can provide improved communication performance (e.g., higher data rates) but their envelope information is not faithfully processed through phase-locked loops because the output signal of a voltage-controlled oscillator is substantially constant over its operating band. In addition, the loop bandwidth is typically limited to provide loop stability and to reduce the noise that is processed onto the transmit signal. Therefore, phase-locked loops also generally fail to faithfully reproduce the phase information of nonconstant-envelope modulations.

Various modifications have been proposed to improve amplitude and phase information processing through phase-locked loops to thereby improve their performance with nonconstant-envelope modulations but these modifications have typically been complex. Accordingly, they impose penalties (e.g., increased parts count, power drain and space requirement) that substantially negate the upconversion advantages of phase-locked loops.

SUMMARY OF THE INVENTION

The present invention is directed to phase-locked loop methods and structures for generating modulated communication signals with nonconstant envelopes. These methods and structures realize the improved communication performance of nonconstant-envelope modulations (e.g., higher data rates) with the upconversion advantages of phase-locked loops (e.g., reduced parts count, space and power drain).

Transmitters of the invention augment a phase-locked loop with first and second feedforward paths that substantially restore phase and amplitude information to a transmit signal that is generated by a voltage-controlled oscillator of the phase-locked loop. The first feedforward path includes a detector that extracts a phase-correction signal from a modulated intermediate-frequency signal and the gain of this path is adjusted to realize a path transfer function of $s/K_v$ wherein the voltage-controlled oscillator has a transfer function of $K_v/s$. The second feedforward path includes another detector that extracts an envelope-correction signal from the modulated intermediate-frequency signal and a variable-gain output amplifier is arranged to amplify the transmit signal with a gain that responds to the envelope-correction signal.

The novel features of the invention are set forth with particularity in the appended claims. The invention will be best understood from the following description when read in conjunction with the accompanying drawings.

BRIEF DESCRIPTION OF THE DRAWINGS

FIGS. 2A–2D are flow diagrams that illustrate process steps in modulation methods that may be practiced with the radio transmitters of the invention;

DETAILED DESCRIPTION OF THE PREFERRED EMBODIMENTS

Figure 4:
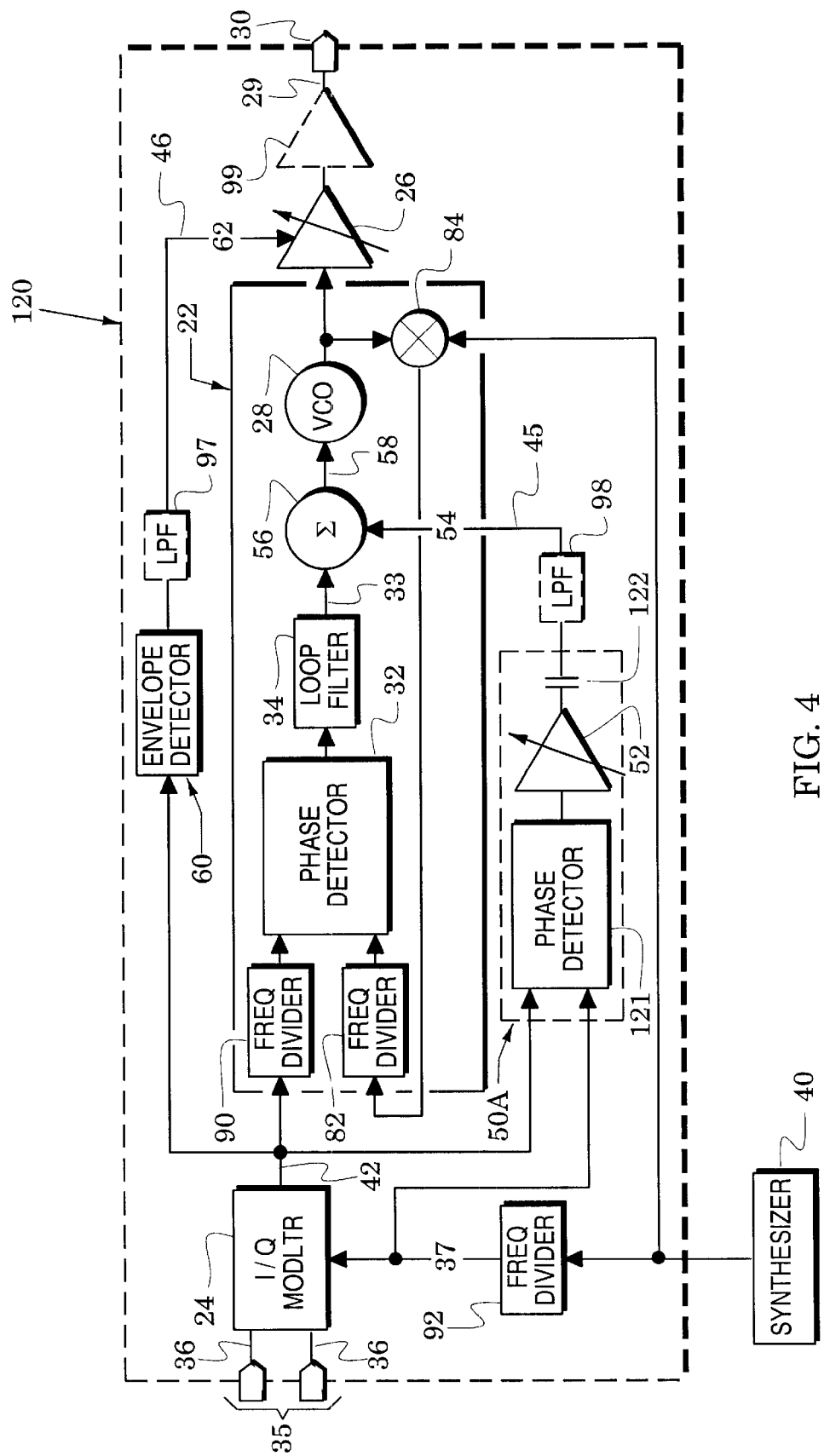
Figure 5:
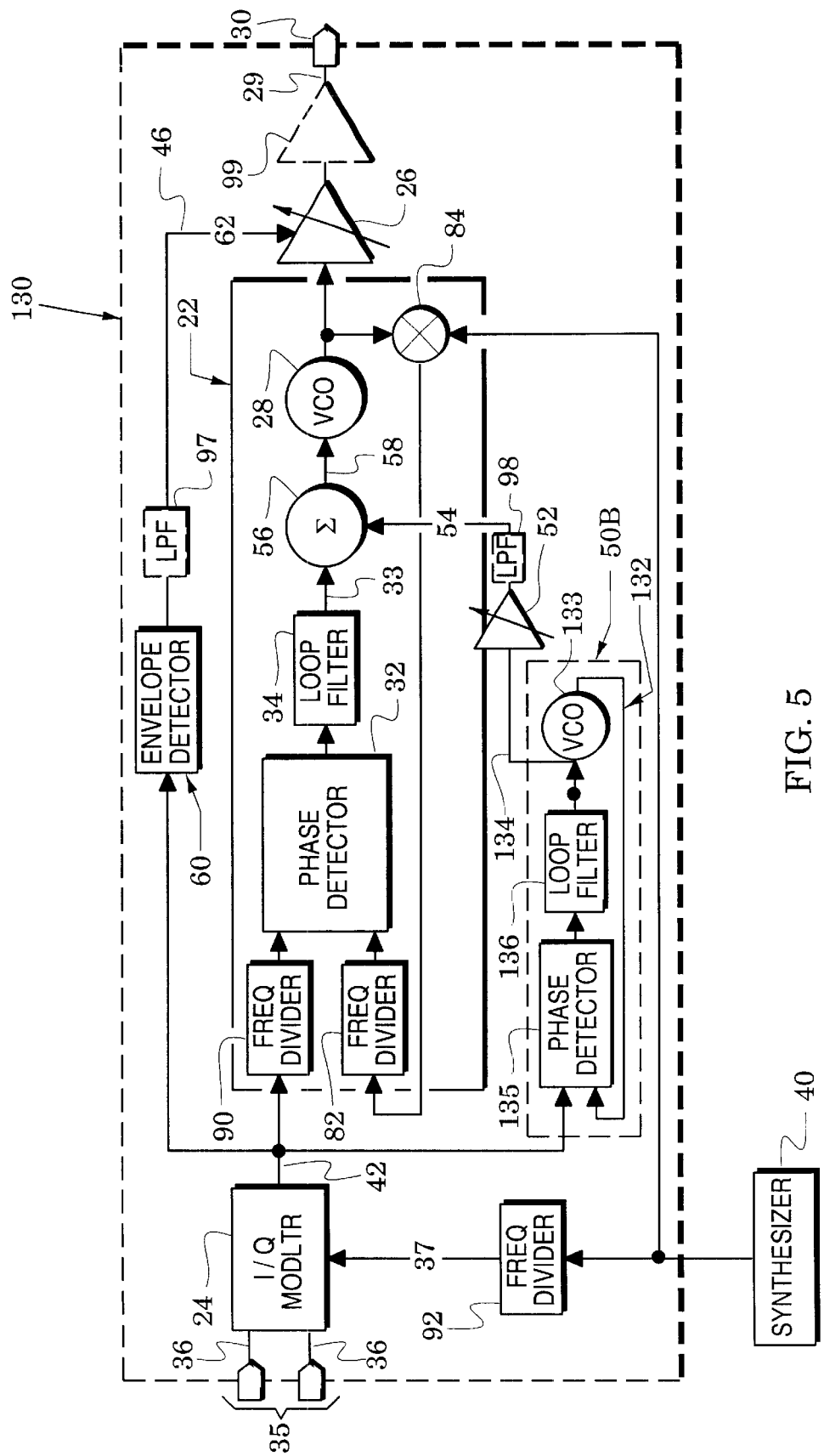
Figure 6:
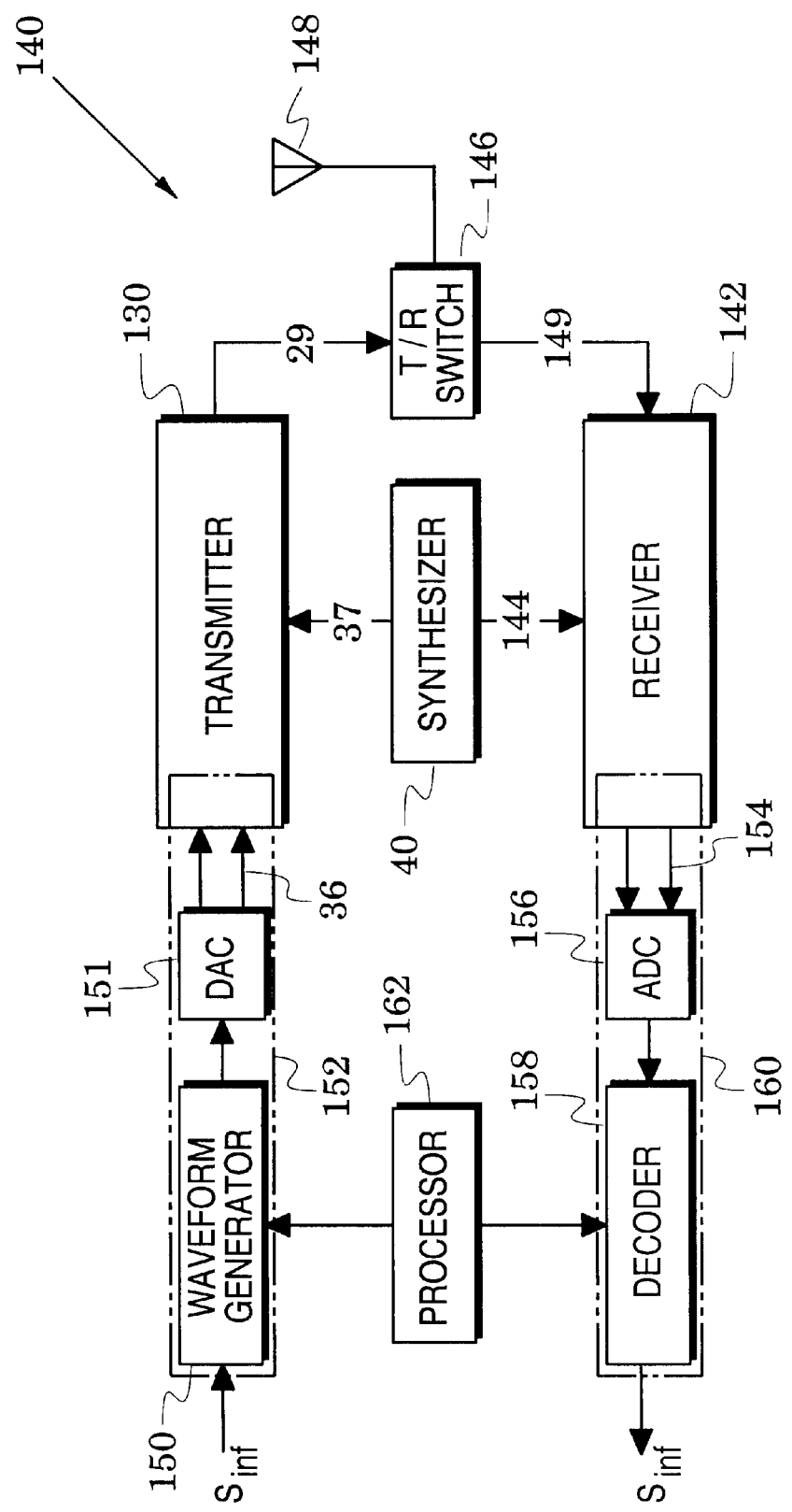
FIG. 6 is a block diagram of a radio embodiment that includes any of the radio transmitters of FIGS. 1 and 3–5.

Transmitter embodiments of the invention are illustrated in FIGS. 1 and 3–5, modulation methods are illustrated in FIGS. 2A–2D and a radio embodiment is illustrated in FIG. 6. These structures and methods enable the use of phase-locked loops for generating transmit signals with nonconstant-envelope modulations. An understanding of the modulation methods of the invention is enhanced by preceding their description with the following investigation of the transmitter 20 of FIG. 1.

The transmitter 20 includes a phase-locked loop 22 that is coupled between an I/Q (in phase/quadrature) modulator 24 and a variable-gain output amplifier 26. The phase-locked loop is formed with a voltage-controlled oscillator 28 that generates a transmit signal 29 which is provided at a transmitter output port 30. A first detector 32 generates an error signal 33 by comparing a sample of the transmit signal 29 to the output of the I/Q modulator 24. The error signal 33 corresponds to the phase difference between the compared signals and it is coupled through a loop filter 34 to the control port of the voltage-controlled oscillator 28. The first detector is a phase detector which may be formed with any of various phase detector structures (e.g., a mixer or a phase-frequency detector).

At an input port 35, the I/Q modulator 24 receives an information signal in the form of I/Q symbol streams 36 and modulates the information signal onto an intermediate frequency 37 which it receives from a synthesizer 40. The I/Q modulator thus delivers a modulated intermediate-frequency signal 42 to the first detector 32. Because the transmitter 20 is directed to the generation of transmit signals that have been modulated to have nonconstant envelopes, the I/Q modulator is preferably configured to effect such a modulation (e.g., 3π8 shifted 8-PSK).

In its operation, the voltage-controlled oscillator 28 generates a radio-frequency signal that has a substantially constant amplitude across the range of the oscillator's output signal. Therefore, the voltage-controlled oscillator 28 will deliver a transmit signal 29 that does not faithfully reproduce the nonconstant envelope of the modulation, i.e., the transmit signal will fail to contain all of the modulation envelope information. In addition, the loop filter 34 substantially establishes the loop bandwidth which is typically limited so as to guarantee loop stability and reduce the noise content of the transmit signal. Therefore, the voltage-controlled oscillator 28 will deliver a transmit signal 29 that does not faithfully reproduce the modulation phase, i.e., the transmit signal will fail to contain all of the modulation phase information.

Figure 1:
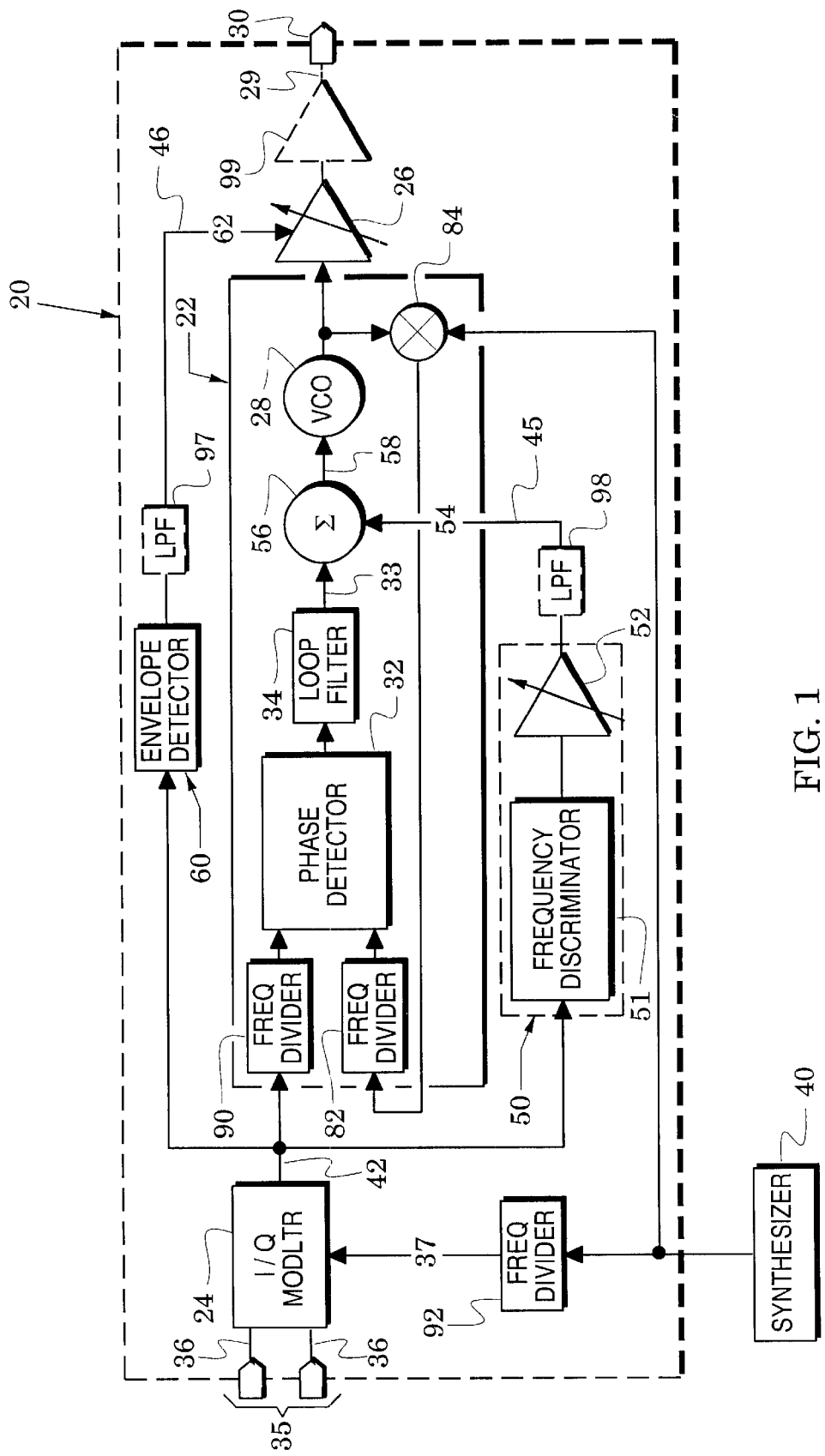
FIG. 1 is a block diagram of a radio transmitter embodiment of the present invention.

Accordingly, the transmitter 20 of FIG. 1 also includes a first feedforward path 45 and a second feedforward path 46 that are configured to substantially restore modulation phase and envelope information to the transmit signal 29 that is generated by the voltage-controlled oscillator 28. The first feedforward path 45 is formed with a second detector 50 that is comprised of a series arrangement of a frequency detector in the form of a discriminator 51 and a variable-gain correction amplifier 52. The second detector 50 extracts a phase-correction signal 54 from the modulated intermediate-frequency signal 42 and adds it to the error signal 33 in a summer 56 to form a sum signal 58 that is applied to the voltage-controlled oscillator 28. The second feedforward path 46 is formed with a third detector in the form of an envelope detector 60 which extracts an envelope-correction signal 62 from the modulated intermediate-frequency signal 42 and this correction signal is directed to control the gain of the variable-gain output amplifier 26.

Figure 2A:
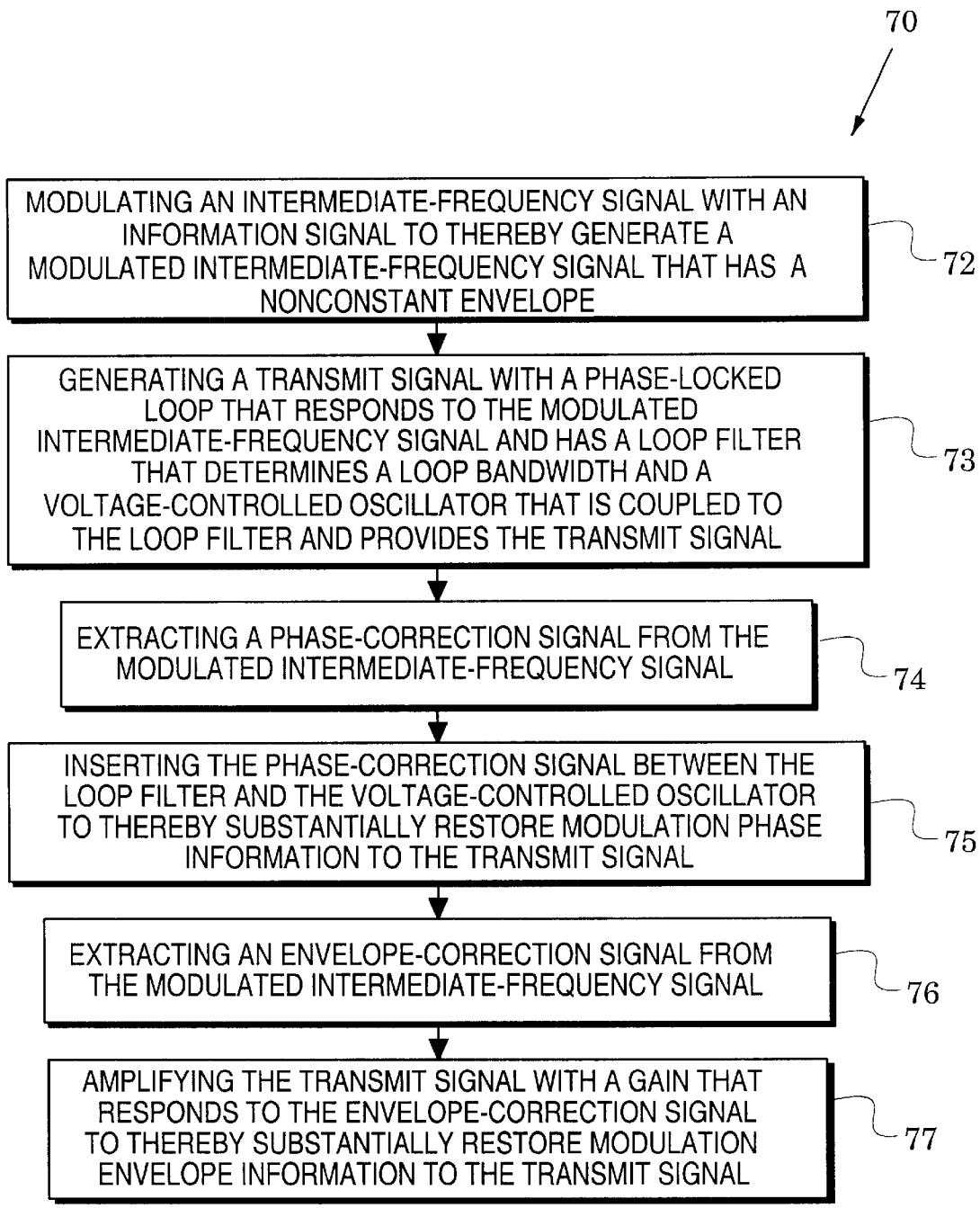

Having investigated the basic structure of the radio transmitter 20, attention is now directed to FIG. 2A which shows a method of the invention for modulating an information signal onto a transmit signal. In a first process step 72, an intermediate-frequency signal is modulated with an information signal to thereby generate a modulated intermediate-frequency signal that has a nonconstant envelope. This process is practiced by the I/Q modulator 24 of FIG. 1. The I/Q modulator is preferably configured to realize a high data rate modulation that generates the modulated intermediate-frequency signal 42 with a nonconstant envelope (an exemplary modulation is shifted M-ary PSK.

In FIG. 2A, a transmit signal is generated in a second process step 73 with a phase-locked loop that responds to the modulated intermediate-frequency signal and has a loop filter that determines a loop bandwidth and a voltage-controlled oscillator that is coupled to the loop filter and provides the transmit signal. This process is practiced by the phase-locked loop 22 of FIG. 2.

In process steps 74 and 75, a phase-correction signal is extracted from the modulated intermediate-frequency signal and inserted between the loop filter and the voltage-controlled oscillator to thereby substantially restore modulation phase information to the transmit signal. These processes are practiced by the second detector 50 of FIG. 1 which generates the phase-correction signal 54 and applies it to the summer 56.

The method 70 preferably includes process steps 76 and 77 in which an envelope-correction signal is extracted from the modulated intermediate-frequency signal and the transmit signal is amplified with a gain that responds to the envelope-correction signal to thereby substantially restore modulation envelope information to the transmit signal. These final processes of FIG. 2A are practiced by the third detector of FIG. 1 which generates the envelope-correction signal 62 and applies it to the variable-gain output amplifier 26. Because the gain of this output amplifier responds to the modulation envelope (as detected by the third detector 60), the modulation envelope is substantially restored to the transmit signal 29.

In FIG. 1, the first detector 32 generates a voltage in response to a phase difference and has a gain of $K_p$, the loop filter provides an output voltage in response to an input voltage and has a transfer function H(s) (wherein s is the Laplace operator s=σ+jω) that equals jω in steady state conditions) and the voltage-controlled oscillator 28 generates a transmit signal whose frequency corresponds to an error voltage and has a transfer function of $K_v/s$. It is apparent, therefore, that the phase-locked loop 22 has an open-loop gain of $K_p H(s) K_v / s$ and a closed-loop gain of $$\frac{\Phi_{out}}{\Phi_{in}} = \frac{K_p H(s) K_v \frac{1}{s}}{1 + K_p H(s) K_v \frac{1}{s}} \quad (1)$$

wherein $\Phi_{out}/\Phi_{in}$ is the phase gain of the phase-locked loop 22. If the gain of the second detector 50 is symbolized by A, then the circuit path across the phase-locked loop 22 that passes through the second detector 50 and the voltage-controlled oscillator 28 has a transfer function of $AK_v/s$ so that the transfer function of equation (1) is modified by the feedforward path 45 to $$\frac{\Phi_{out}}{\Phi_{in}} = \frac{AK_v \frac{1}{s} + K_p H(s) K_v \frac{1}{s}}{1 + K_p H(s) K_v \frac{1}{s}}. \quad (2)$$

In accordance with the invention, it is observed that the transfer function of equation (2) is equal to one for all frequencies if $A=s/K_v$. That is, the modulation bandwidth of the transmitter 20 is infinite (in theory) if the second detector 50 has a transfer function s and this function is properly scaled by the variable-gain correction amplifier 52 (i.e., scaled by $1/K_v$).

In the radio transmitter 20 of FIG. 1, the second detector 50 has a transfer function of s because it is configured to generate the derivative of the phase of the information signal that is inserted at the input port 35. In particular, the second detector includes the frequency discriminator 51 and because frequency is the rate of phase change (i.e., f=df/dt), the frequency discriminator 51 extracts the desired derivative. This embodiment of the second detector 50 is functionally described in FIG. 2B which recites a process step 79 that realizes the phase-correction signal extracting step (74 in FIG. 2A) by frequency-differentiating the modulated intermediate-frequency signal (42 in FIG. 1).

Figure 3:
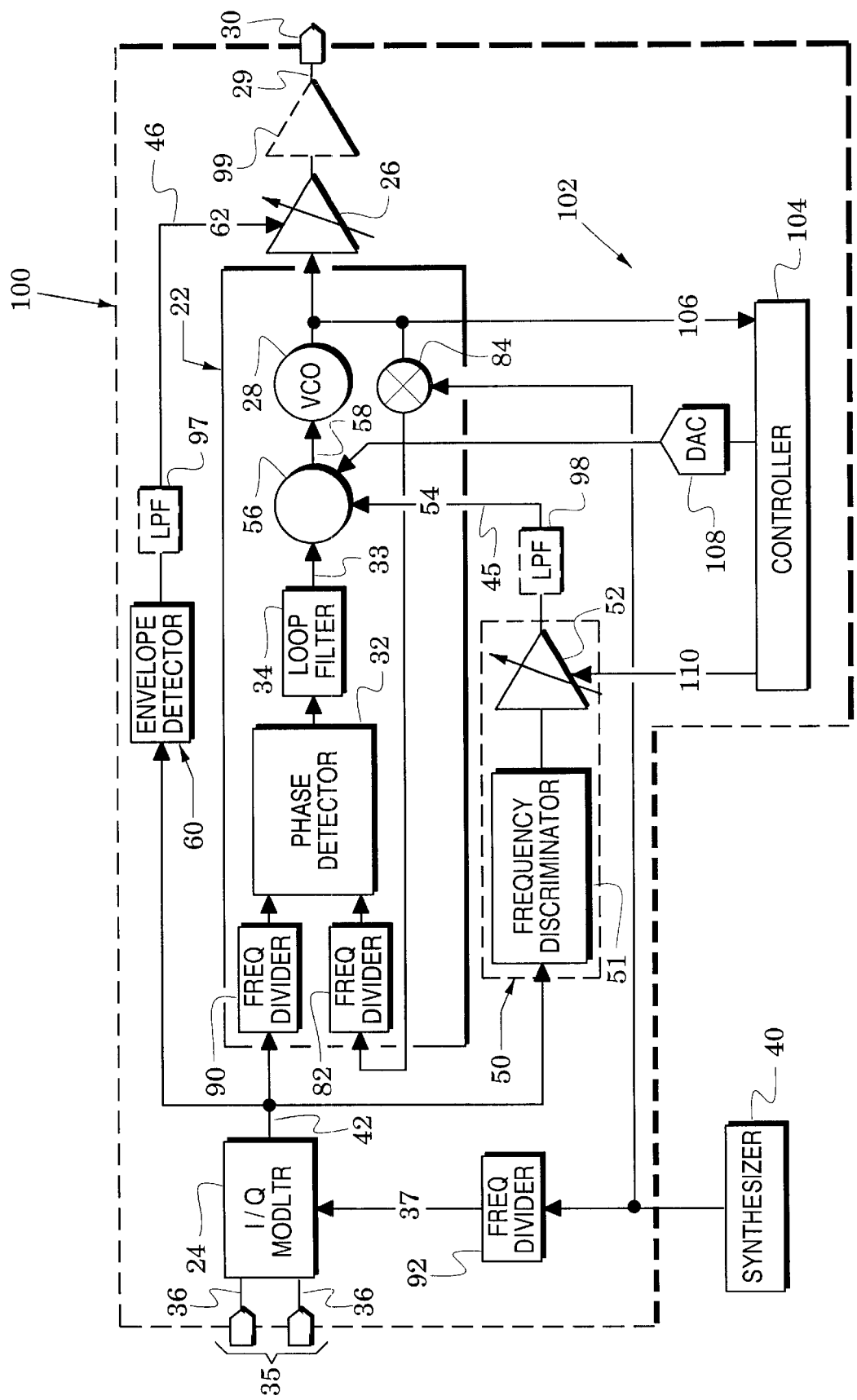
FIGS. 3—5 are block diagrams of other radio transmitter embodiments.

A programmed calibration system for automatically scaling the gain of the second detector 50 to $1/K_v$ is illustrated in the radio transmitter 100 of FIG. 3. A investigation of this system is preceded by the following description of the remaining elements of the transmitter 20 of FIG. 1.

The intermediate-frequency signal 37 of FIG. 1 is provided by a synthesizer 40 and the frequency range of the voltage-controlled oscillator 28 is translated upwards (i.e., upconverted) by a frequency divider 82 that downconverts and couples the transmit signal 29 to the first detector 32. The upconversion range can be further extended with a mixer 84 that downconverts the transmit signal in response to a signal from the synthesizer 40. This downconversion may be used to downconvert the transmit signal into a lower operational range of the frequency divider 82. The transmitter 20 may also be augmented with frequency dividers 90 and 92 which, with frequency divider 82 and mixer 84, permit a variety of transmitter frequency plans to be realized.

Because the second feedforward path 46 may couple noise to the output port 30, it preferably includes a lowpass filter 97 whose passband should be wide to enhance the transfer of envelope information but should be narrow to limit the transfer of noise. Simulations of the transmitter 20 have indicated passbands (e.g., on the order of 5 MHz) that optimize this tradeoff. For the same noise considerations, the first feedforward path 45 also preferably includes a lowpass filter 98 whose passband is configured to be a tradeoff between noise transmission and the transfer of phase information. Simulations of the transmitter have suggested an exemplary filter having a pole in the range of 10 MHz.

The transmitter 20 may also be augmented with a power amplifier 99 that amplifies the transmit signal 29. Because the feedforward path 46 has substantially restored the non-constant modulation envelope at the output of the variable-gain output amplifier 26, the power amplifier 99 should be reasonably linear so that it does not substantially degrade the envelope.

Attention is now directed to the radio transmitter 100 of FIG. 3 which is similar to the radio transmitter 20 of FIG. 1 with like elements indicated by like reference numbers. The transmitter 100, however, includes a programmed calibration system 102 which comprises a controller 104, a controller input path 106 for coupling a sample of the transmit signal 29 to the controller, a digital-to-analog converter (DAC) 108 coupled between the controller and the summer 56 and a controller output path 110 for applying an adjustment voltage to the variable-gain correction amplifier 52. The controller 102 preferably includes a programmed data processor.

In operation of the calibration system 102, the controller 104 applies, through the DAC 108, first and second input voltages that establish a voltage difference $\Delta v$. The controller also monitors, via the input path 106, the resulting frequency response $\Delta f$ of the voltage-controlled oscillator 28 to thereby obtain a measure of the oscillator's gain $K_v = \Delta f / \Delta_v$. The controller 104 then applies an adjustment voltage, via the input path 110, to adjust the gain of the variable-gain correction amplifier 52 to thereby set the gain of the second detector 50 to $1/K_v$. As explained above, the transfer function of equation (2) will now equal one for all frequencies and the modulation bandwidth of the transmitter 20 is substantially extended.

The transmitter 100 is suited for use in a variety of communication systems such as time-division multiple access (TDMA) in which a plurality of system users send information in respective time slots over a common communication channel. Each of the users is often provided with a different subchannel so that the frequency of the voltage-controlled oscillator 28 is programmed across subchannels that correspond to the time slots. In such a communication system, the above-described calibration process is preferably repeated prior to communication bursts over each subchannel.

FIG. 4 illustrates a radio transmitter 120 which is similar to the radio transmitter 20 of FIG. 1 with like elements indicated by like reference numbers. The transmitter 120, however, replaces the second detector 50 of FIG. 1 with a different embodiment 50 A. In the second detector 50 A, the frequency discriminator 51 is replaced by another frequency detector in the form of a serially-connected phase detector 121 and a differentiator in the form of a capacitor 122. The phase detector may be formed with any of various phase detector structures (e.g., a mixer or a phase/frequency detector) and its inputs are coupled to receive the intermediate-frequency signal 37 and the modulated intermediate-frequency signal 42. The differentiator may be formed, for example, by a capacitor or an operational amplifier differentiator.

In its operation, the detector 50 A of FIG. 4 realizes the process steps 124 and 126 of FIG. 2C in which the phase-correction signal extracting step ( 74 in FIG. 2A) includes the steps of a) obtaining the phase difference between the intermediate-frequency signal and the modulated intermediate-frequency signal and b) differentiating the phase difference (e.g., by processing it through a capacitor). Similar to the process 79 of FIG. 2B which is performed by the frequency discriminator 51 of FIG. 1, this process also realizes the derivative of the phase of the information signal at the input port 36 of FIG. 4. That is, the processes 124 and 126 realize a transfer function s so that the second detector 50 A has a transfer function $A = s/K_v$. and, therefore, the transfer function of equation (2) is (in theory) equal to one for all frequencies. Accordingly, the second detector 50A also substantially restores modulation phase information to the transmit signal 29.

FIG. 5 illustrates a radio transmitter 130 which is similar to the radio transmitter 20 of FIG. 1 with like elements indicated by like reference numbers. The transmitter 130, however, replaces the second detector 50 of FIG. 1 with a different embodiment 50 B. This detector embodiment is formed with another frequency detector in the form of a phase-locked loop 132 that has a voltage-controlled oscillator 133 which responds to an error signal 134.

The error signal is generated by a phase detector 135 which responds to the output of the voltage-controlled oscillator 133 and the modulated intermediate-frequency signal 42. A loop filter 136 processes the error signal before it is coupled to the voltage-controlled oscillator 133. The sensitivity of the voltage-controlled oscillator 133 is set to $K_v$ so that its transfer function is $K_v/s$. This causes the transfer function from the detector input (the modulated intermediate-frequency signal 42) to the detector output (the error signal 134) to be $s/K_v$ which, in turn, causes the modulation bandwidth of the transmitter 130 to be infinite (in theory) as indicated above in equation (2). Because this sensitivity may not be sufficiently controlled, however, the detector 50B preferably retains the variable-gain correction amplifier 52 and lowpass filter 98 of the transmitter 20 of FIG. 1.

In its operation, the detector 50 C of FIG. 5 realizes the process steps 137 and 139 of FIG. 2D in which the phase-correction signal extracting step (74 in FIG. 2A) includes the steps of a) phase locking a voltage-controlled oscillator (133 in FIG. 5) to the modulated intermediate-frequency signal (42 in FIG. 5) and b) providing the phase-correction signal as a control signal of the voltage-controlled oscillator. FIGS. 1 and 3–5 have shown transmitter embodiments of the present invention which can be used to form improved radios. FIG. 6 illustrates a radio 140 that includes, for example, the transmitter 130 of FIG. 4 and a receiver 142. A synthesizer 40 provides an intermediate-frequency signal 37 to the transmitter and a downconverting signal in the form of a local oscillator signal 144 to the receiver. A transmit/receive (T/R) switch 146 couples transmit signals 29 to an antenna 148 and receive signals 149 from the antenna to the receiver 142.

Incoming information signals $S_{inf}$ (e.g., data and/or voice) are processed through a waveform generator 150 and associated DAC 151 to provide I/Q symbol streams 36 (also shown in FIG. 3) to the transmitter 100. In an exemplary shifted M-ary PSK modulation process, the information signals $S_{inf}$ are a digital stream that is coded in the waveform generator 150 into a stream of symbols (e.g., 000, 001 - - - 111) which are then converted into respective analog levels by the DAC 151 to form the I/Q symbol streams 36.

An I/Q modulator (24 in FIG. 5) converts the synthesizer signal 37 into cosine and sine signals and, with these latter signals, quadrature modulates the I/Q symbol streams 36 to form a modulated intermediate-frequency signal (42 in FIG. 3). Typically, the waveform generator 150, DAC 151 and I/Q modulator ( 24 in FIG. 3) are collectively referred to as a modulator 152 which is shown in broken lines in FIG. 5.

The receiver 142 may be any of various conventional receivers that downconvert the receive signal 149 with the local-oscillator signal 144 in at least one mixer, filter and amplifier stage. Preferably, noise content is reduced by initially processing the receive signals 149 through a low-noise amplifier.

The downconverted receive signal is then processed with cosine and sine signals to generate I/Q signals 154 which are processed through an analog-to-digital converter (ADC) 156 and a decoder 158 to form the outgoing information signals $S_{inf}$. Typically, the I/Q demodulation process, the ADC 156 and decoder 158 are collectively referred to as a demodulator 160 which is shown in broken lines in FIG. 5. The modulation and demodulation processes (as well as operation of the controller 104 of FIG. 3) are directed by a suitably programmed data processor 162.

Radios, transmitters and process steps of the invention enable the use of phase-locked loops for generating transmit signals with nonconstant-envelope modulations (e.g., shifted M-ary PSK and π/4 differential quadrature PSK π/4 DQPSK). The transmitters include frequency detectors that extract a phase-correction signal which is the derivative of the information signal. Frequency detector embodiments have been provided (e.g., a frequency discriminator, a phase-locked loop and a serial connection of a phase detector and a capacitor).

Operational simulations have investigated a variety of transmitter parameters (e.g., output noise, time delay through the feedforward paths (45 and 46 in FIG. 1), phase-locked loop bandwidth and feedforward path bandwidths) in order to verify the effectiveness of these structures and methods. Because these structures and methods are relatively simple, they reduce communication equipment costs while improving communication performance (e.g., higher data rates).

The term "information signal" has been used herein to signify a signal (e.g., a data signal or a voice signal) that conveys something meaningful to a recipient. A term "s" has been recited above (e.g., in equations (1) and (2)) to describe processes and structures of the invention. This term is the Laplace operator s=σ+jω that equals jω in steady state conditions and it is conventionally used to describe transfer functions.

It has been stated that a loop filter (e.g., the loop filter 34 of FIG. 1) establishes the loop bandwidth of a phase-locked loop. Although the loop filter is the primary determiner of the loop bandwidth, those skilled in the art realize that the transfer functions of other loop elements also contribute to this determination but typically to a lesser degree. For example, the transfer functions of the detector 32 and voltage-controlled oscillator 28 of FIG. 2 were given above as $K_p$ and $K_v/s$. This implies that the terms $K_p$ and $K_v$ are constant with respect to frequency but typically, a more accurate description of these transfer functions would show that they also make minor contributions to determination of the loop bandwidth.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of modulating an information signal onto a transmit signal, comprising the steps of:

modulating an intermediate-frequency signal with said information signal to thereby generate a modulated intermediate-frequency signal that has a nonconstant envelope;

generating said transmit signal with a phase-locked loop that responds to said modulated intermediate-frequency signal and has a loop filter that determines a loop bandwidth and a voltage-controlled oscillator that is coupled to said loop filter and provides said transmit signal;

extracting a phase-correction signal from said modulated intermediate-frequency signal; and inserting said phase-correction signal between said loop filter and said voltage-controlled oscillator to thereby substantially restore modulation phase information to said transmit signal;

wherein said phase-correction signal extracting step includes the step of frequency-differentiating said modulated intermediate-frequency signal.

2. A method of modulating an information signal onto a transmit signal, comprising the steps of:

modulating an intermediate-frequency signal with said information signal to thereby generate a modulated intermediate-frequency signal that has a nonconstant envelope;

generating said transmit signal with a phase-locked loop that responds to said modulated intermediate-frequency signal and has a loop filter that determines a loop bandwidth and a voltage-controlled oscillator that is coupled to said loop filter and provides said transmit signal;

extracting a phase-correction signal from said modulated intermediate-frequency signal; and inserting said phase-correction signal between said loop filter and said voltage-controlled oscillator to thereby substantially restore modulation phase information to said transmit signal;

wherein said phase-correction signal extracting step includes the steps of:

phase locking a second voltage-controlled oscillator to said modulated intermediate-frequency signal; and providing a control signal of said second voltage-controlled oscillator for said phase-correction signal.

3. A method of modulating an information signal onto a transmit signal, comprising the steps of:

modulating an intermediate-frequency signal with said information signal to thereby generate a modulated intermediate-frequency signal that has a nonconstant envelope;

generating said transmit signal with a phase-locked loop that responds to said modulated intermediate-frequency signal and has a loop filter that determines a loop bandwidth and a voltage-controlled oscillator that is coupled to said loop filter and provides said transmit signal;

extracting a phase-correction signal from said modulated intermediate-frequency signal; and inserting said phase-correction signal between said loop filter and said voltage-controlled oscillator to thereby substantially restore modulation phase information to said transmit signal;

obtaining the phase difference between said intermediate-frequency signal and said modulated intermediate-frequency signal; and differentiating said phase difference.

4. The method of claim 1, wherein said voltage-controlled oscillator has a gain $K_v$ and further including the step of adjusting the amplitude of said phase-correction signal to be $1/K_v$.

5. The method of claim 1, further including the steps of:

measuring the gain $K_v$ of said voltage-controlled oscillator; and adjusting the amplitude of said phase-correction signal to be $1/K_v$.

6. The method of claim 1, further including the steps of:

extracting an envelope-correction signal from said modulated intermediate-frequency signal; and amplifying said transmit signal with a gain that responds to said envelope-correction signal to thereby substantially restore modulation envelope information to said transmit signal.

7. The method of claim 6, wherein said envelope-correction signal extracting step includes the step of detecting the envelope of said modulated intermediate-frequency signal.

8. The method of claim 1, wherein said modulating step includes the step of forming a modulated intermediate-frequency signal with a nonconstant envelope.

9. A radio transmitter comprising:

an I/Q modulator that generates a modulated intermediate-frequency signal with a nonconstant envelope in response to an information signal and an intermediate-frequency signal;

a phase-locked loop which includes a voltage-controlled oscillator that generates a transmit signal and further includes a first detector that generates an error signal in response to a phase difference between said modulated intermediate-frequency signal and a sample of said transmit signal; and a second detector that extracts a phase-correction signal from said modulated intermediate-frequency signal wherein said voltage-controlled oscillator generates said transmit signal in response to a sum signal that is the sum of said error signal and said phase-correction signal;

wherein said second detector is a frequency detector that responds to said modulated intermediate-frequency signal;

modulation phase information thereby substantially restored to said transmit signal.

10. The transmitter of claim 9, wherein said frequency detector includes:

a frequency discriminator that generates said phase-correction signal in response to said modulated intermediate-frequency signal; and a variable-gain correction amplifier that adjusts the amplitude of said phase-correction signal.

11. The transmitter of claim 9, wherein said frequency detector includes:

a phase detector that generates a phase-difference signal in response to said modulated signal and said modulated intermediate-frequency signal;

a capacitor that processes said phase-difference signal into said phase-correction signal; and a variable-gain correction amplifier that adjusts the amplitude of said phase-correction signal.

12. The transmitter of claim 9, wherein said frequency detector includes a second voltage-controlled oscillator that is phase locked to said modulated intermediate-frequency signal and wherein said phase-correction signal is a control signal of said second voltage-controlled oscillator.

13. A radio transmitter of claim 11, comprising:

an I/Q modulator that generates a modulated intermediate-frequency signal with a nonconstant envelope in response to an information signal and an intermediate-frequency signal;

a phase-locked loop which includes a voltage-controlled oscillator that generates a transmit signal and further includes a first detector that generates an error signal in response to a phase difference between said modulated intermediate-frequency signal and a sample of said transmit signal; and a second detector that extracts a phase-correction signal from said modulated intermediate-frequency signal wherein said voltage-controlled oscillator generates said transmit signal in response to a sum signal that is the sum of said error signal and said phase-correction signal;

wherein said second detector includes a variable-gain correction amplifier that adjusts the amplitude of said phase-correction signal and further including:

a digital-to-analog converter (DAC); and a controller that applies a calibration signal to said voltage-controlled oscillator via said DAC and monitors said transmit signal to thereby ascertain a gain $K_v$ of said voltage-controlled oscillator;

wherein said controller applies a gain adjustment signal to said variable-gain correction amplifier to adjust its gain to substantially $1/K_v$;

modulation phase information thereby substantially restored to said transmit signal.

14. The transmitter of claim 9, further including:

a third detector that extracts an envelope-correction signal from said modulated intermediate-frequency signal; and a variable-gain output amplifier that amplifies said transmit signal with a gain that is controlled by said envelope-correction signal;

modulation envelope information thereby substantially restored to said transmit signal.

15. The transmitter of claim 14, wherein said third detector is an envelope detector that responds to said modulated intermediate-frequency signal.

16. The transmitter of claim 9, wherein said I/Q modulator generates said modulated intermediate-frequency signal with a nonconstant envelope.

17. The transmitter of claim 9, wherein said phase-locked loop further includes:
- a summer that is coupled to said voltage-controlled oscillator and that forms said sum signal in response to said error signal and said phase-correction signal; and
- a loop filter that couples said first detector to said summer and that is configured to establish a loop bandwidth of said phase-locked loop.

18. A radio, comprising:
- a synthesizer that generates an intermediate-frequency signal and a downconverting signal;
- a modulator that generates a modulated intermediate-frequency signal with a nonconstant envelope in response to an incoming information signal and said intermediate-frequency signal;
- a transmitter that has:
  a) a phase-locked loop which includes a voltage-controlled oscillator that generates a transmit signal and further includes a first detector that generates an error signal in response to a phase difference between said modulated intermediate-frequency signal and a sample of said transmit signal; and
  b) a second detector that extracts a phase-correction signal from said modulated intermediate-frequency signal wherein said voltage-controlled oscillator generates said transmit signal in response to a sum signal that is the sum of said error signal and said phase-correction signal;
- an antenna coupled to said transmitter to radiate said transmit signal;
- a receiver that generates a downconverted signal in response to said downconverting signal and a receive signal from said antenna; and
- a demodulator that demodulates said downconverted signal to form an outgoing information signal;
- modulation phase information substantially restored to said transmit signal by said phase-correction signal.

19. The radio of claim 18, wherein said phase-correction signal is the derivative of the phase of said information signal.

20. The radio of claim 18, wherein said second detector is a frequency detector that responds to said modulated intermediate-frequency signal.

21. The radio of claim 18, wherein said frequency detector includes:
- a frequency discriminator that generates said phase-correction signal in response to said modulated intermediate-frequency signal; and
- a variable-gain correction amplifier that adjusts the amplitude of said phase-correction signal.

22. The radio of claim 18, wherein said frequency detector includes:
- a phase detector that generates a phase-difference signal in response to said modulated signal and said modulated intermediate-frequency signal;
- a capacitor that processes said phase-difference signal into said phase-correction signal; and
- a variable-gain correction amplifier that adjusts the amplitude of said phase-correction signal.

23. The radio of claim 18, wherein said frequency detector includes a second voltage-controlled oscillator that is phase locked to said modulated intermediate-frequency signal and wherein said phase-correction signal is a control signal of said second voltage-controlled oscillator.

24. The radio of claim 18, wherein said second detector includes a variable-gain correction amplifier that adjusts the amplitude of said phase-correction signal and further including:
- a digital-to-analog converter (DAC); and
- a controller that applies a calibration signal to said voltage-controlled oscillator via said DAC and monitors said transmit signal to thereby ascertain a gain $K_v$ of said voltage-controlled oscillator;
- wherein said controller applies a gain adjustment signal to said variable-gain correction amplifier to adjust its gain to substantially $1/K_v$.

25. The radio of claim 18, further including:
- a third detector that extracts an envelope-correction signal from said modulated intermediate-frequency signal; and
- a variable-gain output amplifier that amplifies said transmit signal with a gain that is controlled by said envelope-correction signal;
- modulation envelope information thereby substantially restored to said transmit signal.

* * * * *